(12) United States Patent
Liu et al.

(10) Patent No.: US 10,406,782 B2
(45) Date of Patent: Sep. 10, 2019

(54) HIGHLY CONDUCTIVE TRANSPARENT LAMINATED GLASS ARTICLE

(71) Applicant: WUHAN HUASHANG GREEN TECHNOLOGY CO., LTD., Wuhan, Hubei (CN)

(72) Inventors: Lianjia Liu, Hubei (CN); Qingliang Gai, Hubei (CN); Xiaojiang You, Hubei (CN)

(73) Assignee: WUHAN HUASHANG GREEN TECHNOLOGY CO., LTD., Wuhan, Hubei (CN)

( * ) Notice: Subject to any disclaimer, the term of this patent is extended or adjusted under 35 U.S.C. 154(b) by 0 days.

(21) Appl. No.: 16/073,467

(22) PCT Filed: Jan. 25, 2017

(86) PCT No.: PCT/CN2017/072576
§ 371 (c)(1),
(2) Date: Jul. 27, 2018

(87) PCT Pub. No.: WO2017/133613
PCT Pub. Date: Aug. 10, 2017

(65) Prior Publication Data
US 2019/0030864 A1  Jan. 31, 2019

(30) Foreign Application Priority Data
Feb. 3, 2016  (CN) .......................... 2016 1 0075787

(51) Int. Cl.
*B32B 17/10* (2006.01)
*B32B 17/00* (2006.01)
(Continued)

(52) U.S. Cl.
CPC ........ *B32B 17/10183* (2013.01); *B32B 17/00* (2013.01); *B32B 17/1022* (2013.01);
(Continued)

(58) Field of Classification Search
CPC ............. H01L 29/1606; H01L 31/0488; H01L 31/049; H01L 31/18; H05K 2201/0108;
(Continued)

(56) References Cited

U.S. PATENT DOCUMENTS

| 2014/0131076 A1* | 5/2014 | Kuroiwa | H05K 3/22 174/255 |
| 2016/0133350 A1* | 5/2016 | Uchida | H05K 1/095 427/508 |

FOREIGN PATENT DOCUMENTS

| CN | 101201152 A | 6/2008 |
| CN | 102543633 A | 7/2012 |

(Continued)

OTHER PUBLICATIONS

English Machine translation of CN103113786A provided with Office Action (Year: 2013).*

(Continued)

*Primary Examiner* — Roshn K Varghese
(74) *Attorney, Agent, or Firm* — Muncy, Geissler, Olds & Lowe, P.C.

(57) ABSTRACT

A highly conductive transparent laminated glass article includes two glass plates and an adhesive film. The adhesive film has a material of Poly(Vinyl Butyral) (PVB) resin and is located between the two glass plates. At least one of the two glass plates is a highly conductive transparent glass-based circuit board with a glass substrate. A surface of the glass substrate is not contact with the adhesive film. A conductive paste, printed on the surface of the glass substrate, is baked, heated, and cooled to form a conductive circuit fused with the surface of the glass substrate. The surface of the glass substrate and an upper surface of the conductive circuit are at the same level. The highly conductive transparent laminated glass article has the characteristics of high conductivity and high light transmittance. The (Continued)

highly conductive transparent laminated glass article is suitable for fabrication, manufacture, and use of industrial and smart-home devices.

5 Claims, 2 Drawing Sheets

(51) Int. Cl.
    *H05K 1/03*     (2006.01)
    *B32B 27/30*     (2006.01)
    *H05K 1/09*     (2006.01)
    *H05K 1/11*     (2006.01)

(52) U.S. Cl.
    CPC .. *B32B 17/10036* (2013.01); *B32B 17/10091* (2013.01); *B32B 17/10238* (2013.01); *B32B 17/10761* (2013.01); *B32B 27/30* (2013.01); *H05K 1/0306* (2013.01); *H05K 1/0313* (2013.01); *H05K 1/092* (2013.01); *H05K 1/111* (2013.01); *B32B 2255/205* (2013.01); *B32B 2255/28* (2013.01); *B32B 2307/202* (2013.01); *B32B 2307/412* (2013.01); *B32B 2419/00* (2013.01); *B32B 2457/08* (2013.01); *B32B 2605/006* (2013.01); *H05K 2201/0108* (2013.01); *H05K 2201/0323* (2013.01)

(58) Field of Classification Search
    CPC . H05K 2201/0323; H05K 2201/09881; H05K 2201/09436; H05K 2201/09372; H05K 1/0306; H05K 1/0313; H05K 1/092; H05K 1/111; B32B 17/10183; B32B 17/00; B32B 17/10036; B32B 17/10091; B32B 17/1022; B32B 17/10238; B32B 17/10761; C09D 11/52
    See application file for complete search history.

(56) References Cited

FOREIGN PATENT DOCUMENTS

| | | | |
|---|---|---|---|
| CN | 103113786 A | * | 5/2013 |
| CN | 104464883 A | | 3/2015 |
| CN | 104816521 A | | 8/2015 |
| CN | 105522791 A | | 4/2016 |

OTHER PUBLICATIONS

Original CN103113786A provided with Office Action (Year: 2013).*
English Machine translation of CN104464883A provided with Office Action (Year: 2015).*

* cited by examiner

HIGHLY CONDUCTIVE TRANSPARENT LAMINATED GLASS ARTICLE

CROSS-REFERENCE TO RELATED APPLICATIONS

This application is the National Stage of International Application No. PCT/CN2017/072576 filed on Jan. 25, 2017, which claims benefits of Chinese Application No. 201610075787.7 filed on Feb. 3, 2016, the disclosure of which is incorporated by reference.

TECHNICAL FIELD

The present invention relates to a highly conductive transparent laminated glass article, and more particularly to a highly conductive transparent laminated glass article, which belongs to the field of manufacturing an electronic device.

BACKGROUND

A laminated glass article of the prior art is commonly used as a safety glass article or a sound-insulated glass article in building and automotive fields. The laminated glass article of the prior art is essentially composed of two glass plates and an adhesive film. In general, the adhesive film has a material of Poly(Vinyl Butyral) (PVB) resin and is located between the two glass plates. With the advance of science and technology, a conductive circuit has been embedded in the laminated glass article for wildly used in industrial and smart home devices.

However, a glass-based circuit board in the laminated glass article of the prior art is commonly manufactured by a coating and etching process or a low-temperature silver paste process. The coating and etching process is to coat a conductive paste on a glass substrate and then to etch the conductive paste to form a conductive circuit. That is, the conductive circuit is bonded to the glass plate through an adhesive. Because glass molecules cannot chemically react with any element except fluorine, the coating and etching process is basically a spraying technique, which is a bonding process of organic materials mixing with conductive metal particles. The adhesive reduces the purity of the conductive paste so the conductive capability of the conductive circuit is very poor, wherein the electrical impedance of the best material is only $1\times10^{-4}\Omega$. It is difficult to weld electronic components, and it is also difficult to implement functional circuits. The low-temperature silver paste process is to print a silver paste on a surface of a glass substrate through a screen printing technique, and then to bake and curing at a temperature of less than 200° C. to form a conductive circuit. The low-temperature silver paste process cannot achieve high conductive capability because the silver paste contains a large amount of organic bonding materials. The electrical impedance of the conductive circuit can only reach $3\times10^{-5}\Omega$. It is still difficult to weld electronic components, and it has poor adhesion. Due to the limitation of the two processes, the glass substrate and the conductive circuit are not tightly bonded, and a surface of the conductive circuit is higher than the surface of the glass substrate. Because a surface of the glass-based circuit board is not smooth, the conductive circuit is easily damaged and peeled off, resulting in poor conductive capability.

SUMMARY

For solving the above problems of the prior art, the present invention is to provide a highly conductive transparent laminated glass article. A conductive circuit is tightly fused with a glass substrate. It is a fusional relation between the conductive circuit and the glass substrate. A surface of the glass substrate and an upper surface of the conductive circuit are at the same level. Because a surface of the highly conductive transparent glass-based circuit board is smooth, the conductive circuit is not easily damaged. The highly conductive transparent glass-based circuit board has the characteristics of high conductivity and high transmittance. The highly conductive transparent laminated glass article is suitable for wildly used in industrial and smart home devices.

For solving the above problems of the prior art, the present invention is to provide a highly conductive transparent laminated glass article, which includes two glass plates and an adhesive film. The adhesive film has a material of Poly(Vinyl Butyral) (PVB) resin and is located between the two glass plates. At least one of the two glass plates is a highly conductive transparent glass-based circuit board with a glass substrate. A surface of the glass substrate is not contact with the adhesive film. A conductive paste, printed on the surface of the glass substrate, is baked, heated, and cooled to form a conductive circuit fused with the surface of the glass substrate. The conductive circuit is made essentially of a graphene layer or a conductive layer. The conductive layer has a graphene upper portion and a metal lower portion fused with the glass substrate, and a surface of the graphene upper portion is fused with a surface of the metal lower portion. The glass substrate is a glass-tempered substrate. A surface of the conductive circuit, except a region reserved for a solder pad used for welding a component, is covered with a printed-circuit-board (PCB) organic solder-resistant layer.

The surface of the glass substrate and an upper surface of the conductive circuit are at the same level.

The conductive paste includes conductive powder, low temperature glass powder, ethyl cellulose, terpineol, and dibutyl maleate. A mass ratio of conductive powder:low temperature glass powder:ethyl cellulose:terpineol:dibutyl maleate is 65 to 75:3:5 to 10:10 to 20:1 to 3. The conductive powder is graphene powder or a mixture of metal powder and graphene powder. When the conductive powder is the mixture of metal powder and graphene powder, the graphene powder accounts for 2% to 5% by mass of the conductive paste.

A surface of the glass-tempered substrate faces air, and the conductive paste, printed on the surface of the glass-tempered substrate, is baked at a temperature between 120 and 150° C. for 100 to 200 seconds, placed at a temperature between 550 and 600° C. for 300 to 360 seconds, then placed at a temperature between 710 and 730° C. ° C. for 120 to 220 seconds, and finally cooled to form the conductive circuit fused with the surface of the glass-tempered substrate.

The thickness of each of the two glass plates is 5 mm to 8 mm.

The thickness of the adhesive film is 1 mm to 2 mm.

The thickness of each of the two glass plates is 6 mm, and the thickness of the adhesive film is 1.14 mm.

The highly conductive transparent laminated glass article of the present invention has the advantages described as follows:

(1) The conductive circuit is tightly fused with the glass substrate. It is a fusional relation between the conductive circuit and the glass substrate. The highly conductive transparent glass-based circuit board has the characteristic of superconductivity, wherein the electrical impedance of the conductive circuit of the highly conductive transparent glass-based circuit board is lower than $5\times10^{-8}\Omega$.

(2) The conductive circuit is fused with the glass substrate without any bonding medium so the conductive circuit has the characteristic of good thermal conductivity in high power applications. The conductive circuit is tightly fused with surface molecules of the glass substrate, wherein a surface-mounted-device (SMD) can be bonded on the conductive circuit and the surface-mounted-device (SMD) is not easily peeled off.

(3) The graphene powder accounts for 2% to 5% by mass of the conductive paste. Although the content of the graphene in the conductive paste is very little, the arrangement of molecules of the graphene are extremely dense, molecules of the graphene are light to enable to float on the surface of metal molecules, wear resistance of the graphene is higher than wear resistance of metal, and the graphene has high conductivity. Thus, the conductive circuit has still high conductivity. The graphene is almost transparent so that the highly conductive transparent glass-based circuit board has high light transmittance of more than 90%.

(4) The surface of the glass substrate and the upper surface of the conductive circuit are at the same level. Because a surface of the highly conductive transparent glass-based circuit board is smooth, the conductive circuit is not easily damaged.

(5) The conductive circuit is coated with the printed-circuit-board (PCB) organic solder-resistant layer, wherein the surface of the conductive circuit, except the region reserved for the solder pad used for welding the component, is covered with the printed-circuit-board (PCB) organic solder-resistant layer. This coated process of the present invention is named for the second coated process. The second coated process is used for protecting the conductive circuit and preventing oxidation of the surface of the conductive circuit so as to maintain the ability of superconductivity.

In the figures: numeral 1 represents highly conductive transparent glass-based circuit board; numeral 1-1 represents glass substrate; numeral 1-2 represents conductive circuit; numeral 1-3 represents solder pad; numeral 1-4 represents PCB organic solder-resistant layer; numeral 1-5 represents graphene upper portion; numeral 1-6 represents metal lower portion; numeral 2 represents PVB adhesive film; and numeral 3 represents glass plates.

DETAILED DESCRIPTION OF THE EMBODIMENTS

The present invention will be further described below in conjunction with accompanying drawings and exemplary embodiments.

Figure 1:
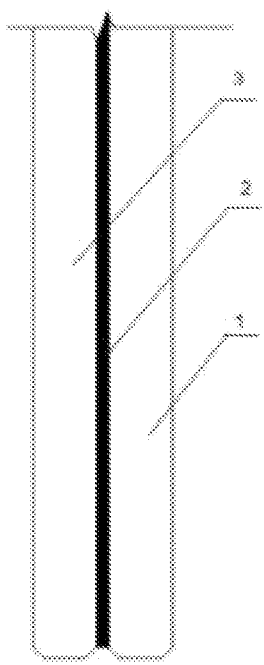
FIG. 1 is a schematic view showing the structure of a highly conductive transparent laminated glass article according to the present invention.
Figure 2:
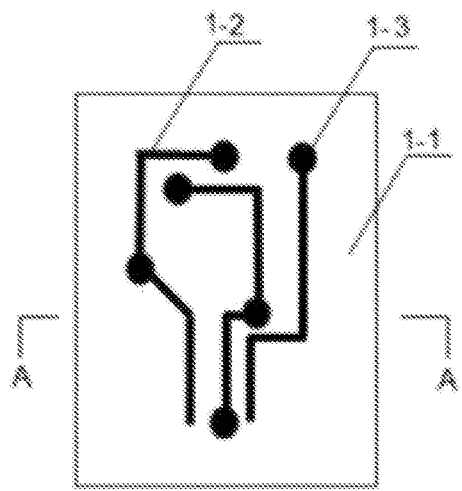
FIG. 2 is a schematic view showing the structure of a highly conductive transparent glass-based circuit board according to the present invention.
Figure 3:
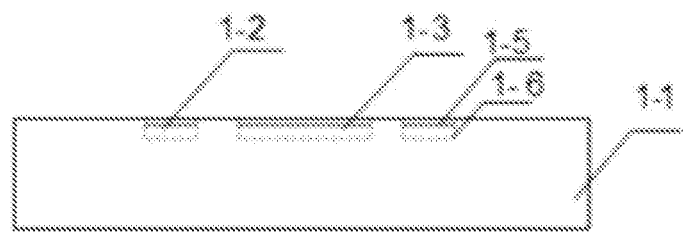
FIG. 3 is a cross sectional view taken along line A-A of FIG. 2.

Please refer to FIGS. 1 to 3. The present invention provides a highly conductive transparent laminated glass article. The highly conductive transparent laminated glass article includes two glass plates 3 and an adhesive film 2. The adhesive film 2 has a material of Poly (Vinyl Butyral) (PVB) resin and is located between the two glass plates 3. At least one of the two glass plates 3 is a highly conductive transparent glass-based circuit board 1 with a glass substrate 1-1. A surface of the glass substrate 1-1 is not contact with the adhesive film 2. A conductive paste, printed on the surface of the glass substrate 1-1, is baked, heated, and cooled to form a conductive circuit 1-2 fused with the surface of the glass substrate 1-1. The conductive circuit 1-2 is a made essentially of a graphene layer or a conductive layer. The conductive layer has a graphene upper portion 1-5 and a metal lower portion 1-6 fused with the glass substrate 1-1, and a surface of the graphene upper portion 1-5 is fused with a surface of the metal lower portion 1-6. The surface of the glass substrate 1-1 and an upper surface of the conductive circuit 1-2 are at the same level.

The conductive paste includes conductive powder, low temperature glass powder, ethyl cellulose, terpineol, and dibutyl maleate. A mass ratio of conductive powder:low temperature glass powder:ethyl cellulose:terpineol:dibutyl maleate is 65 to 75:3:5 to 10:10 to 20:1 to 3. The conductive powder is graphene powder or a mixture of metal powder and graphene powder. When the conductive powder is the mixture of metal powder and graphene powder, the graphene powder accounts for 2% to 5% by mass of the conductive paste.

The glass substrate 1-1 is a glass-tempered substrate. A surface of the glass-tempered substrate faces air, and the conductive paste, printed on the surface of the glass-tempered substrate, is baked at a temperature between 120 and 150° C. for 100 to 200 seconds, placed at a temperature between 550 and 600° C. for 300 to 360 seconds, then placed at a temperature between 710 and 730° C. for 120 to 220 seconds, and finally cooled to form the conductive circuit 1-2 fused with the surface of the glass-tempered substrate.

The glass substrate 1-1 is the glass-tempered substrate.

The thickness of each of the two glass plates 3 is 5 mm to 8 mm.

The thickness of the adhesive film 2 is 1 mm to 2 mm.

The thickness of each of the two glass plates 3 is 6 mm, and the thickness of the adhesive film 2 is 1.14 mm.

Figure 4:
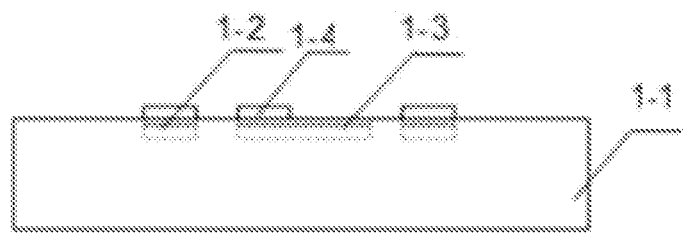
FIG. 4 is a cross sectional view showing the structure of a highly conductive transparent glass-based circuit board covered with a printed-circuit-board (PCB) organic solder-resistant layer according to the present invention.

Please refer to FIG. 4. A surface of the conductive circuit 1-2, except a region reserved for a solder pad 1-3 used for welding a component, is covered with a printed-circuit-board (PCB) organic solder-resistant layer 1-4.

The manufacturing process of the highly conductive transparent glass-based circuit board 1 is described as follows:

Step (1): To print the conductive paste on the surface of the glass substrate 1-1, wherein the surface of the glass substrate 1-1 faces air. The conductive paste includes conductive powder, low temperature glass powder, ethyl cellulose, terpineol, and dibutyl maleate. A mass ratio of conductive powder:low temperature glass powder:ethyl cellulose:terpineol:dibutyl maleate is 65 to 75:3:5 to 10:10 to 20:1 to 3. The conductive powder is the graphene powder or the mixture of metal powder and graphene powder. When the conductive powder is the mixture of metal powder and graphene powder, the graphene powder accounts for 2% to 5% by mass of the conductive paste, wherein the shape of metal particles in the conductive paste is polyhedral.

Step (2): To bake the glass substrate 1-1, covered with the conductive paste, at a temperature between 120 and 150° C. for 100 to 200 seconds.

Step (3): To place the glass substrate 1-1 at a temperature between 550 and 600° C. for 300 to 360 seconds, then to place at a temperature between 710 and 730° C. for 120 to 220 seconds, and finally to cool to room temperature to form the conductive circuit 1-2 distributed on the surface of the glass substrate 1-1 and fused with the surface of the glass substrate 1-1, wherein the conductive circuit 1-2 is to form a part of the glass substrate 1-1.

Step (4): To coat the conductive circuit 1-2 with the printed-circuit-board (PCB) organic solder-resistant layer 1-4 by a screen printing technique, wherein the surface of the conductive circuit 1-2, except the region reserved for the solder pad 1-3 used for welding the component, is totally covered with the printed-circuit-board (PCB) organic solder-resistant layer 1-4. The printed-circuit-board (PCB) organic solder-resistant layer 1-4 is colorless. This coated process of the present invention is named for the second coated process.

In step (3), the glass substrate 1-1 can be tempered through a rapid cooling process. Thus, the glass substrate 1-1 of highly conductive transparent glass-based circuit board 1 is a glass-tempered substrate.

The conductive past has a special ratio of the mixture. In the baked process of the step (2) and the fused process of the step (3), the glass substrate 1-1 begins to soften at a temperature of 500° C., and surface molecules of the glass substrate 1-1 begin to be activated at a temperature of 550° C. The low-temperature glass powders are melted to bring the conductive powders to fused with activated surface molecules of the glass substrate 1-1; meanwhile, the terpineol and the dibutyl maleate in the conductive paste are volatilized at a high temperature. In this stage, surface molecules of the glass substrate 1-1 are not activated at a temperature of less than 550° C., and the glass substrate 1-1 is easily broken at a temperature of more than 600° C. After fused for 5 to 6 minutes, the conductive powders begin to be activated at a temperature around 720° C. to fuse with more activated surface molecules of the glass substrate 1-1 for 2 to 4 minutes. In this stage, the temperature should not be less than 710° C. or more than 730° C. to prevent excessive deformation of the glass substrate 1-1. At this time, the molecules of the conductive powder have been fully fused with the surface of the glass substrate 1-1, and the fusion is a molecular level. The bonding force of the highly conductive transparent glass-based circuit board 1 is stronger than the bonding force of the glass-based circuit board of the traditional process using the adhesive. The surface of the glass substrate 1-1 and the surface of the conductive circuit 1-2 are at the same level to make the surface of the highly conductive transparent glass-based circuit board 1 smooth. The highly conductive transparent glass-based circuit board 1 is suitable for a variety of applications.

Metal particles in the conductive paste can be grinded into a shape of sphere, cube or irregular polyhedron, wherein the metal particles, grinded into the shape of cubes, can be arranged neatly for improving electrical conductivity. The graphene powder accounts for 2% to 5% by mass of the conductive paste. Although the content of the graphene in the conductive paste is very little, the arrangement of molecules of the graphene are extremely dense, molecules of the graphene are light to enable to float on the surface of metal molecules, wear resistance of the graphene is higher than wear resistance of metal, and the graphene has high conductivity. Thus, the conductive circuit 1-2 has still high conductivity. The graphene is almost transparent so the highly conductive transparent glass-based circuit board 1 has high light transmittance.

The second coated process is used for protecting the conductive circuit 1-2 and preventing oxidation of the surface of the conductive circuit 1-2. The traditional process is a coated process or paste process (e.g. sintering and coating film). The second coated process is that two materials are bond by intermolecular interpenetration so the two materials can be firmly bonded and cannot be easily peeled off. After the second coated process, the surface of the highly conductive transparent glass-based circuit board 1 is still smooth, and the solder pad 1-3 can be used for welding the component (e.g. an electronic component).

The highly conductive transparent glass-based circuit board 1 has a light transmittance of more than 90% and has the characteristic of superconductivity, wherein the electrical impedance of the conductive circuit 1-2 of the highly conductive transparent glass-based circuit board 1 is lower than $5 \times 10^{-8} \Omega$. The conductive circuit 1-2 is bonding to the glass substrate 1-1 without any bonding medium so the conductive circuit 1-2 has the characteristic of good thermal conductivity in high power applications. The conductive circuit 1-2 is tightly fused with surface molecules of the glass substrate 1-1, wherein a surface-mounted-device (SMD) can be bonded on the conductive circuit 1-2 and the surface-mounted-device (SMD) is not easily peeled off.

The highly conductive transparent glass-based circuit board 1 is combined with the adhesive film 2 and the other glass plate of the two glass plates 3 to form the highly conductive transparent laminated glass article. The highly conductive transparent laminated glass article not only has the characteristics of heat insulation and sound insulation in the laminated glass article of the prior art, but also has the characteristics of high conductivity and high light transmittance. The highly conductive transparent laminated glass article is suitable for fabrication, manufacture, and use of industrial and smart-home devices.

What is claimed is:

1. A highly conductive transparent laminated glass article, comprising:

two glass plates, at least one of the two glass plates being a highly conductive transparent glass-based circuit board with a glass substrate; and an adhesive film, having a material of Poly(Vinyl Butyral) (PVB) resin and located between the two glass plates, wherein a surface of the glass substrate is not contact with the adhesive film, and a conductive paste, printed on the surface of the glass substrate, is baked, heated, and cooled to form a conductive circuit fused with the surface of the glass substrate;

wherein the conductive circuit is made essentially of a graphene layer or a conductive layer having a graphene upper portion and a metal lower portion fused with the glass substrate, and a surface of the graphene upper portion is fused with a surface of the metal lower portion;

wherein the glass substrate is a glass-tempered substrate, and a surface of the conductive circuit, except a region reserved for a solder pad used for welding a component, is covered with a printed-circuit-board (PCB) organic solder-resistant layer;

wherein the conductive paste includes conductive powder, low temperature glass powder, ethyl cellulose, terpineol, and dibutyl maleate at a mass ratio of 65 to 75:3:5 to 10:10 to 20:1 to 3, and the conductive powder is graphene powder or a mixture of metal powder and graphene powder;

wherein, when the conductive powder is the mixture of metal powder and graphene powder, the graphene powder accounts for 2% to 5% by mass of the conductive paste; and wherein a surface of the glass-tempered substrate faces air, and the conductive paste, printed on the surface of the glass-tempered substrate, is baked at a temperature between 120 and 150° C. for 100 to 200 seconds, placed at a temperature between 550 and 600° C. for 300 to 360 seconds, then placed at a temperature between 710 and 730° C. for 120 to 220 seconds, and finally cooled to form the conductive circuit fused with the surface of the glass-tempered substrate.

2. The highly conductive transparent laminated glass article of claim 1, wherein the surface of the glass substrate and an upper surface of the conductive circuit are at the same level.

3. The highly conductive transparent laminated glass article of claim 1, wherein the thickness of each of the two glass plates is 5 mm to 8 mm.

4. The highly conductive transparent laminated glass article of claim 3, wherein the thickness of each of the two glass plates is 6 mm, and the thickness of the adhesive film is 1.14 mm.

5. The highly conductive transparent laminated glass article of claim 1, wherein the thickness of the adhesive film is 1 mm to 2 mm.

\* \* \* \* \*